United States Patent
Maa et al.

(10) Patent No.: US 7,361,526 B2
(45) Date of Patent: Apr. 22, 2008

(54) GERMANIUM PHOTO DETECTOR HAVING PLANAR SURFACE THROUGH GERMANIUM EPITAXIAL OVERGROWTH

(75) Inventors: Jer-Shen Maa, Vancouver, WA (US); Jong-Jan Lee, Camas, WA (US); Sheng Teng Hsu, Camas, WA (US); Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 266 days.

(21) Appl. No.: 11/353,802

(22) Filed: Feb. 13, 2006

(65) Prior Publication Data

US 2007/0099315 A1    May 3, 2007

Related U.S. Application Data

(63) Continuation-in-part of application No. 11/260,955, filed on Oct. 27, 2005.

(51) Int. Cl.
*H01L 21/00* (2006.01)

(52) U.S. Cl. ............................ 438/57; 438/29; 438/59; 438/200

(58) Field of Classification Search ................. 438/29, 438/59, 200, 57
See application file for complete search history.

(56) References Cited

U.S. PATENT DOCUMENTS

2005/0205954 A1*   9/2005   King et al. ................. 257/431

OTHER PUBLICATIONS

Li et al., *Selective growth of Ge on Si(100) through vias of $SiO_2$ nanotemplate using solid source molecular beam epitaxy*, Applied Physics Letters, vol. 83, No. 24, 5032-5034, (2003).

Li et al., *Heteroepitaxy of high-quality Ge on Si by nanoscale Ge seeds grown through a thin layer of $SiO_2$*, Applied Physics Letters, vol. 85, No. 11, 1928-1930, (2003).

Langdo et al., *High quality Ge on Si by epitaxial necking*, Applied Physics Letters, vol. 76, No. 25, 3700-3702, (2000).

* cited by examiner

*Primary Examiner*—Kiesha Rose
*Assistant Examiner*—Eric W Jones
(74) *Attorney, Agent, or Firm*—David C. Ripma

(57) ABSTRACT

A method of fabricating a germanium photo detector includes preparing a silicon substrate wafer and depositing and planarizing a silicon oxide layer on the silicon substrate. Contact holes are formed in the silicon oxide layer. An N+ epitaxial germanium layer is grown on the silicon oxide layer and in the contact holes. An N+ germanium layer is formed by ELO. The structure is smoothed and thinned. An intrinsic germanium layer is grown on the N+ epitaxial germanium layer. A P+ germanium layer is formed on the intrinsic germanium layer and a silicon oxide overcoat is deposited. A window is opened through the silicon oxide overcoat to the P+ germanium layer. A layer of conductive material is deposited on the silicon oxide overcoat and in the windows therein. The conductive material is etched to form individual sensing elements.

19 Claims, 7 Drawing Sheets

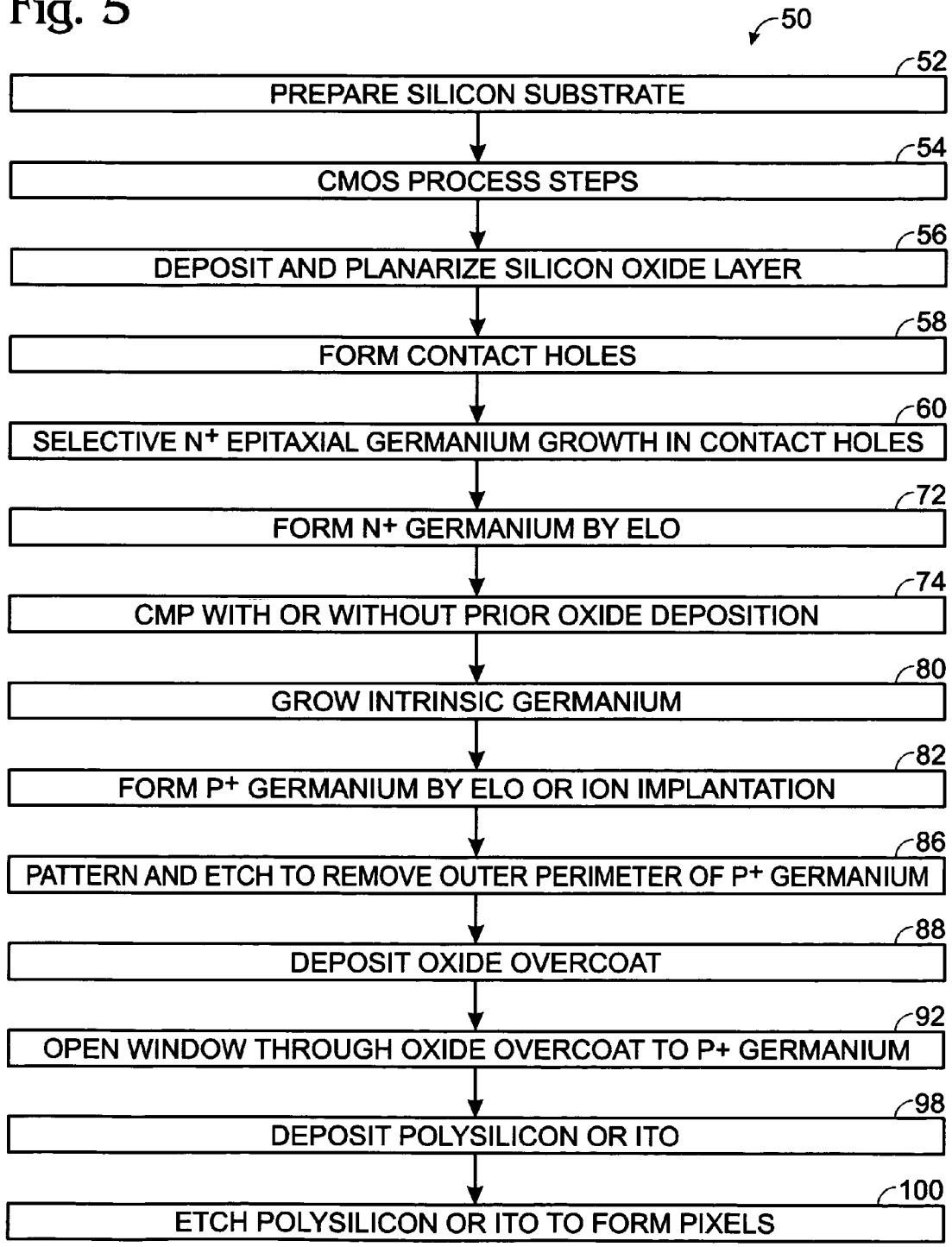

GERMANIUM PHOTO DETECTOR HAVING PLANAR SURFACE THROUGH GERMANIUM EPITAXIAL OVERGROWTH

RELATED APPLICATIONS

This Application is a Continuation-in-Part of Ser. No. 11/260,955, filed Oct. 27, 2005, for *Method of Fabricating a Germanium Photo Detector on a High Quality Germanium Epitaxial Overgrowth Layer.*

FIELD OF THE INVENTION

This invention relates to infra-red sensors, and specifically to a method for fabricating a germanium photodetector, on a silicon wafer, having a planar surface, which greatly reduces interface current leakage.

BACKGROUND OF THE INVENTION

Because of a lattice mismatch between a germanium lattice and a silicon lattice, epitaxial growth of germanium directly on a silicon wafer results in a high density of dislocations at the Ge/Si interface. These dislocations are detrimental to the electrical performance of any germanium device fabricated on a silicon substrate. In order to reduce the dislocations at the Ge/Si interface, a germanium epitaxial lateral overgrowth (ELO) technique has been used.

Li et al., demonstrated that germanium may be selectively grown on Si(100) through openings in a $SiO_2$ nanotemplate by solid source MBE. Germanium islands grow in the template windows and coalesce on top of the template, forming an epitaxial ELO layer. Cross sectional TEM images show that germanium seeds and the ELO layer are free of threading dislocations. Only stacking faults are generated, but terminate within 70 nm of the Ge-Si interface, while twins along {111} planes are observed in the ELO layer. Li et al., *Selective growth of Ge on Si(100) through vias of $SiO_2$ nanotemplate using solid source molecular beam epitaxy*, Applied Physics Letters, Vol. 83, No. 24, 5032-5034, (2003), and Li et al., *Heteroepitaxy of high-quality Ge on Si by nanoscale Ge seeds grown through a thin layer of $SiO_2$*, Applied Physics Letters, Vol. 85, No. 11, 1928-1930, (2003).

Langdo et al., *High quality Ge on Si by epitaxial necking*, Applied Physics Letters, Vol. 76, No. 25, 3700-3702, (2000), demonstrated that germanium grown selectively on a $SiO_2$/Si substrate in 100 nm holes by chemical vapor deposition is nearly perfect at the top surface, compared to conventional germanium lattice-mismatched growth on planar silicon substrates. The threading dislocations generated at the Ge/Si interface are blocked at the oxide sidewall by the epitaxial necking mechanism. Defects at the germanium film surface only arise at the merging of epitaxial lateral overgrowth fronts from neighboring holes.

Although the two techniques use different growth methods, i.e., MBE and CVD, both produce a dislocation-free epitaxial lateral overgrowth layer. However, the twin planes are generated on the ELO layer because of the merging of ELO fronts from neighboring holes. Electrical characteristics of such germanium devices fabricated on the ELO germanium layer are not any better than devices fabricated on germanium layers directly grown on silicon wafers. This is because the twin plane is also a crystal defect that, electrically, behaves similarly to a dislocation. FIG. 1 depicts a cross-section diagram 10 of a prior art germanium layer 12 grown on silicon 14, through windows 16 in a $SiO_2$ layer 18, demonstrating the principles of epitaxial necking showing zero threading dislocations at the germanium film surface. However, twin planes 20 are generated as a result of merging of epitaxial lateral overgrowth fronts from neighboring windows.

In our related application, identified above, we presented a germanium photo detector structure that is twin plane free and has device electrical performance unaffected by dislocations. The basic concept for our prior process, depicted generally at 22 in FIG. 2, includes fabrication of a silicon CMOS device on a silicon substrate wafer 24 prior to germanium device fabrication. CMOS fabrication includes N+ ion implantation to form an N+ layer 26 for the bottom electrode of the photodiodes. A layer of $SiO_2$ 28 is deposited and CMP planarized. Contact holes are formed in the $SiO_2$ layer. After contact hole 30 formation, selective in situ N+-doped epitaxial germanium 34 is grown in the contact holes. The threading dislocations 36 rise up on (111) planes in <110>directions, and make a 45° angle to the underlying Si(100) substrate. Consequently, the dislocations are effectively contained inside the holes. Continued germanium deposition results in formation of intrinsic germanium layer 38 by epitaxial lateral overgrowth (ELO), and is followed by ELO growth of a P+ germanium layer 40. A layer 42 of polysilicon or $In_2O_3$—$SnO_3$, (ITO) is deposited. The final prior art structure is shown in FIG. 3. Because the germanium ELO exhibits many facets, as shown in the SEM image of FIG. 4, formation of an in situ boron doped germanium layer is preferred in this step.

This previous disclosure offers a simple method to fabricate germanium photodetectors with defect-free germanium film. However, in cases where interface leakage is prevalent, the performance of the germanium photodetector is likely limited because of the abrupt interface between germanium and oxide.

SUMMARY OF THE INVENTION

A method of fabricating a germanium photo detector includes preparing a silicon substrate wafer; depositing and planarizing a silicon oxide layer; forming contact holes in the silicon oxide layer which communicate with the underlying silicon substrate; selectively growing an epitaxial germanium layer of a first type on the silicon oxide layer and in the contact holes; forming a germanium layer of the first type by epitaxial lateral overgrowth; smoothing and thinning the germanium layer of the first type by chemical mechanical polishing; growing an intrinsic germanium layer on the epitaxial germanium layer of the first type and on any exposed silicon oxide layer; forming a germanium layer of a second type on the intrinsic germanium layer; depositing a silicon oxide overcoat over the wafer; opening a window through the silicon oxide overcoat to the germanium layer of the second type; depositing a layer of conductive material on the silicon oxide overcoat and in the windows therein; and etching the conductive material to form individual sensing elements.

It is an object of the invention to use a germanium epitaxial lateral overgrowth (ELO) technique to grow a defect-free ELO layer.

Another object of the invention is to limit the ELO process so that no coalescence occurs between adjacent ELO fronts.

A further object of the invention is to use specific doping techniques to keep the dislocations away from an electrically active layer.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 5 is a block diagram of the method of the invention.

DETAILED DESCRIPTION OF THE PREFERRED EMBODIMENTS

The basic technique is similar to our co-pending Application, incorporated herein by reference, which includes (1) using a germanium epitaxial lateral overgrowth (ELO) technique to grow a defect-free ELO layer, (2) limiting the ELO process so that no coalescence occurs between adjacent ELO fronts, and (3) using the doping technique to keep the dislocations away from the electrically active layer.

Figure 6:
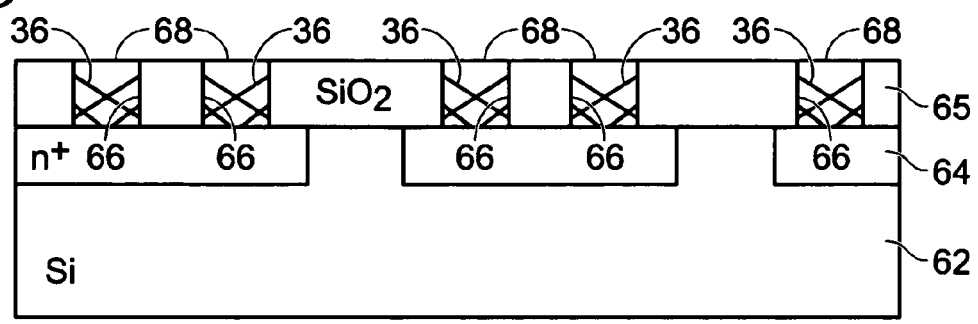
FIGS. 6-16 depict steps in the method of the invention.

A significant difference between the method described in our co-pending Application and this Application is the provision of a vertical structure, having a planar surface, which is fabricated in parallel with the silicon surface and extends to the vertical sidewall, and is not grown on an oxide layer. This structure eliminates substantially all interface leakage from the contact of overgrown germanium and oxide. As many of the steps of the method of the invention are similar to the those of the co-pending Application, only those steps of the method of the invention which are different are described in detail below:

Referring to FIG. 5, the method of the invention is depicted generally at 50, and includes silicon wafer preparation 52. Silicon CMOS devices may be fabricated 54 prior to germanium device fabrication, as described in the previous disclosure. A layer of silicon oxide is deposited and patterned 56. After contact holes 58 are formed in the $SiO_2$ layer, selective N+-doped epitaxial germanium, also referred to herein as a germanium layer of a first type, is grown 60 in the contact hole, as shown in FIG. 6, wherein a silicon substrate wafer 62 has N+ regions 64, an oxide layer 65, and contact holes 66. After contact holes 66 are formed, they are filled with in situ doped N+ germanium epitaxial layer 68.

Figure 1:
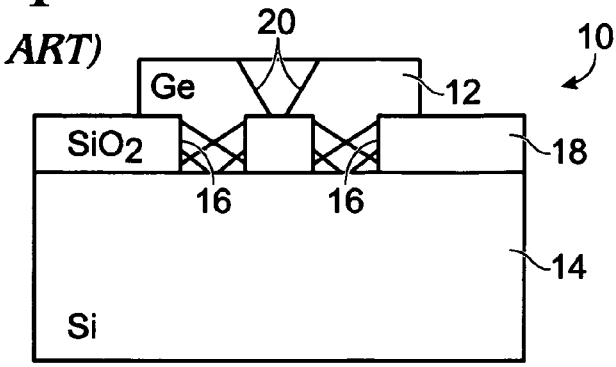
FIGS. 1-3 depict steps in a prior art technique for forming a germanium layer on a silicon substrate.
Figure 2:
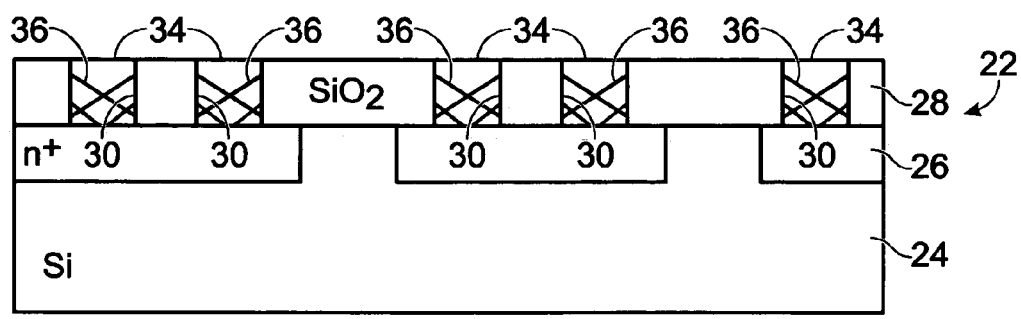
Figure 3:
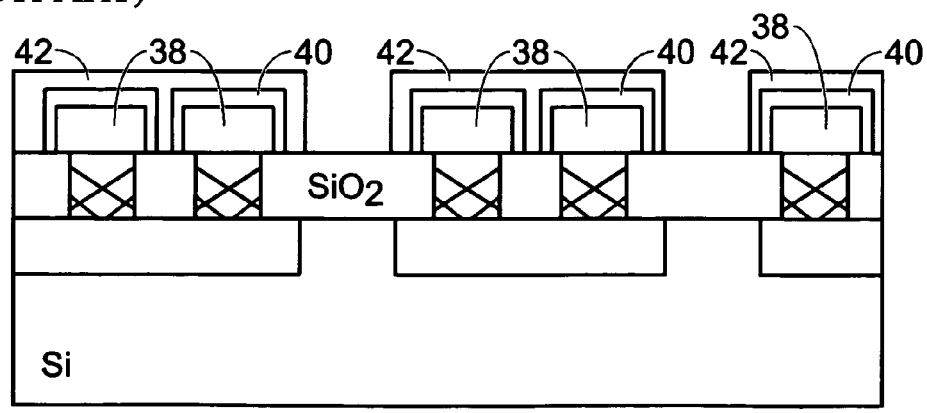
Figure 4:
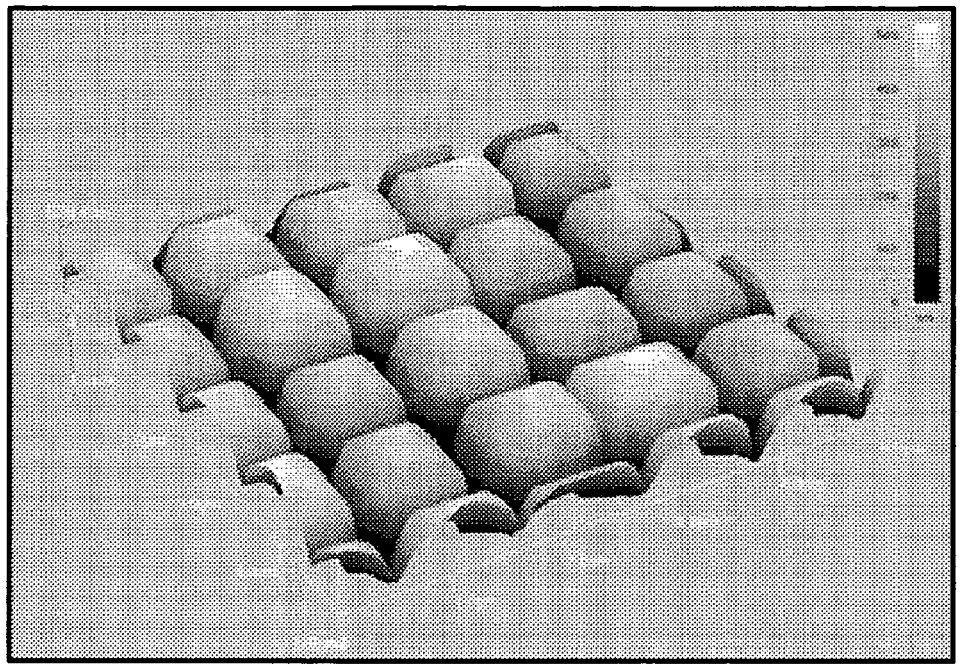
FIG. 4 depicts a SEM image of germanium ELO of the prior art.
Figure 7:
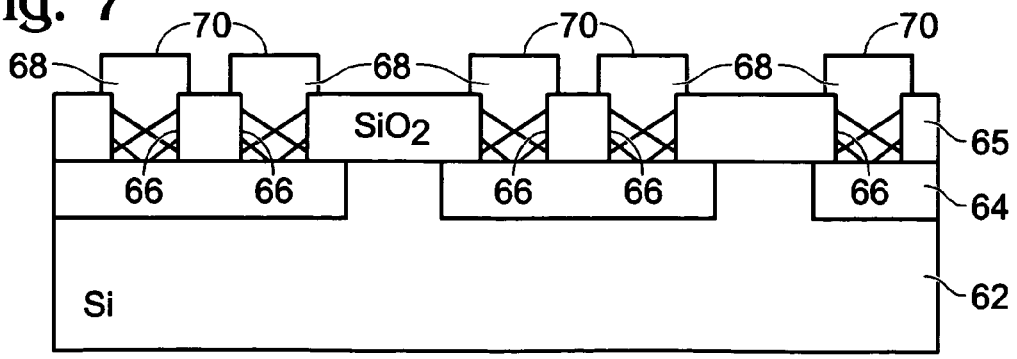

FIG. 7 depicts the growth of N+ germanium overgrowth layer 70 by epitaxial lateral overgrowth 72. Although in FIG. 7 the surface of the germanium appears flat, the single crystal germanium contains many faceting planes, as shown in FIG. 4.

Figure 8:
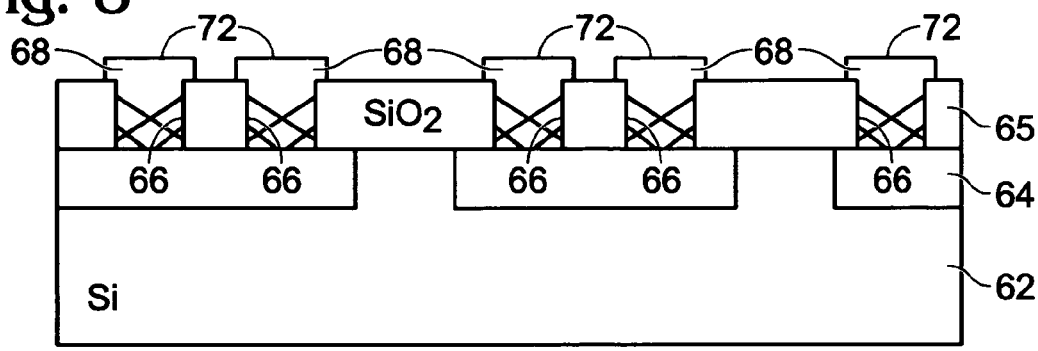
Figure 9:
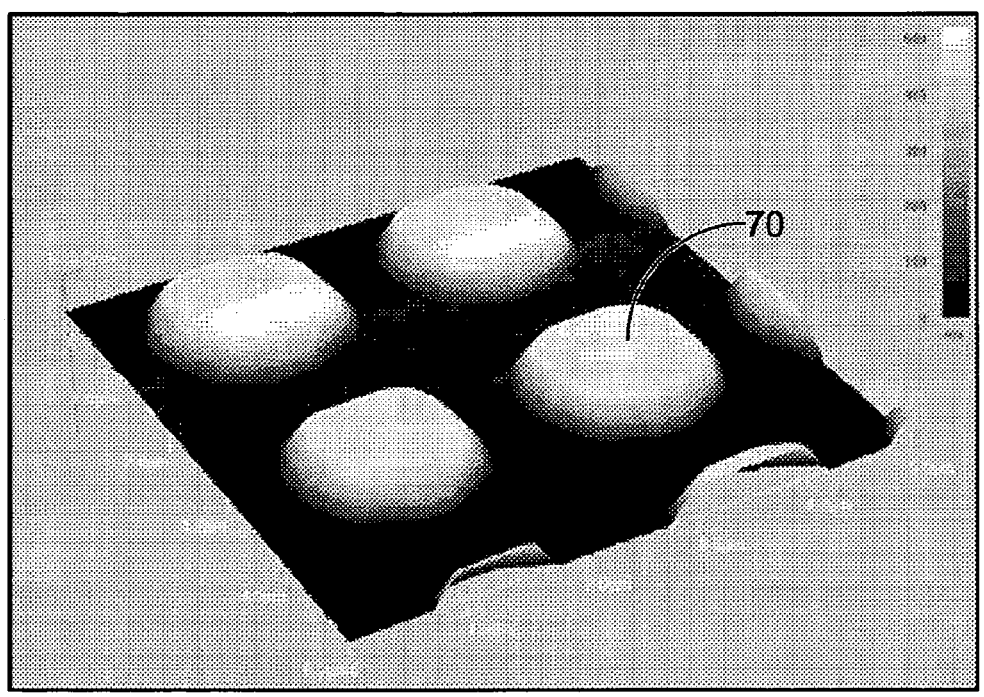
Figure 10:
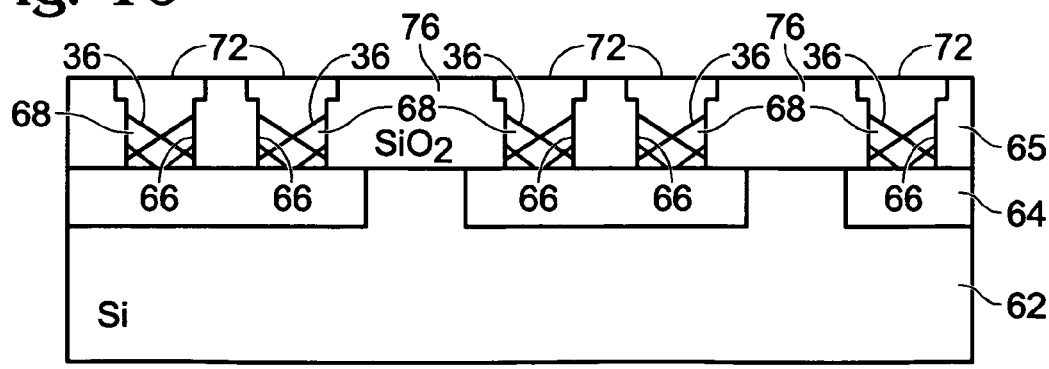

Chemical mechanical polishing 74 is performed to remove most of the faceting region of the overgrown germanium crystal. As shown in FIGS. 8 and 9, overgrowth layer 70 becomes thinner. An alternative method is to deposit an oxide layer 76 (FIG. 10) on the germanium crystals before the CMP process. In this case, a CMP process with similar polishing rate of oxide and germanium is applied, and a planar surface is achieved after the faceting feature of the germanium crystal is removed, as shown FIG. 10.

Figure 11:
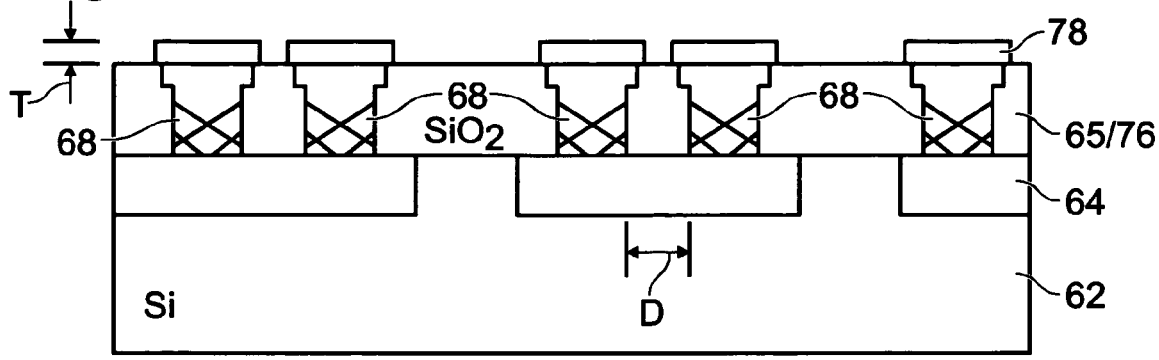

The following steps assume that the aforementioned oxide layer is applied before the CMP process, however, the method of the invention is quite similar if oxide is not applied. Referring to FIG. 11, intrinsic germanium 78 is grown 80 on top of the N+ELO layer. The intrinsic germanium thickness, "T", is between about 100 nm to 2000 nm. The distance, "D", between two contact holes is larger than twice the ELO thickness, so that the neighboring ELO growth fronts will not merge together. Clearly, the drawings are not to scale, particularly with regard to dimensions T and D, however, the relationship of T and D are important to the success of the method of the invention. As shown in FIG. 11, the intrinsic layer extends beyond the edge of the underlying N+ germanium crystal. Because the surface of the underlying N+ germanium is very flat, the intrinsic germanium layer is also flat, and exhibits thinning, with crystal plane faceting, at the edge.

Figure 12:
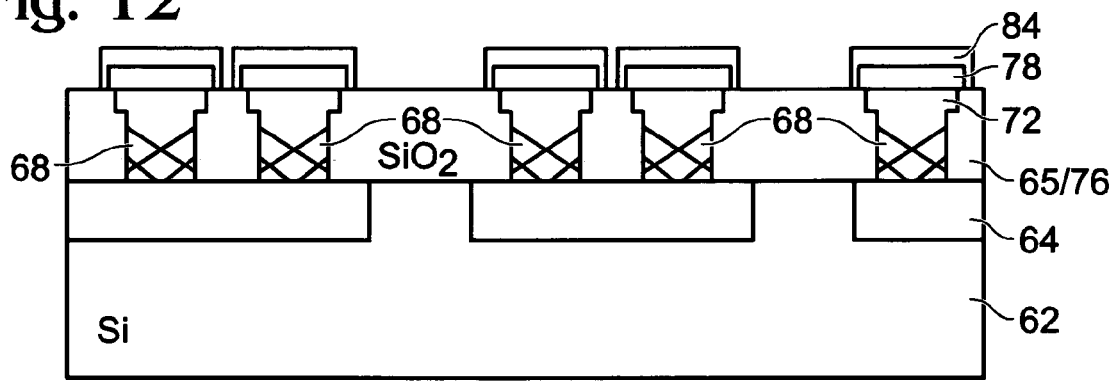

ELO growth 82 of P+ germanium layer 84, also referred to herein as a germanium layer of a second type, is shown in FIG. 12. An in situ boron doped germanium layer is preferred in this step. The P+ germanium layer thickness is between about 30 nm to 300 nm. It is preferred to have thinner P+ germanium layer to allow most of the light to be absorbed in the intrinsic layer, which, again, renders this dimension important. Although in situ P+ doped germanium ELO growth is preferred at this step, P+ ion implantation, followed by activation of the intrinsic ELO germanium layer, is also feasible. The ion implantation may be performed by conventional ion implantation or by plasma immersion technique. The latter technique is preferred, as it is able to implant the ions uniformly regardless of the germanium shape.

Figure 13:
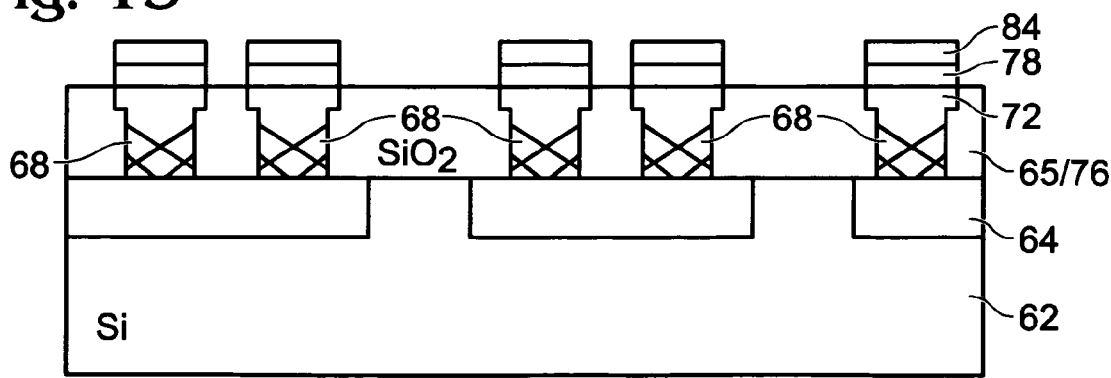

A photolithiographic step and an etching step 86 are provided in this embodiment to remove the outer perimeter region of the P+ germanium and intrinsic germanium. It is possible to remove the outer perimeter region of the N+ germanium overgrown region. In the case where an oxide layer is deposited before CMP of germanium layer, there is a possibility that a small trench will be etched between the edge of the N+ germanium overgrowth crystal and the oxide sidewall. In case where there is no oxide deposition before CMP, the etching of P+Ge, intrinsic germanium and N+ germanium will stop at the upper surface of the underlying oxide layer. The resultant structure is depicted in FIG. 13.

Figure 14:
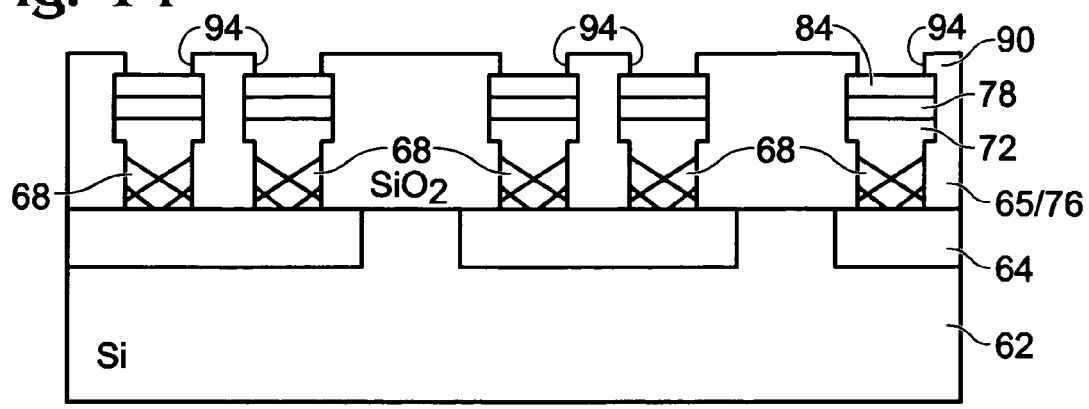

The next step requires deposition 88 of an oxide overcoat 90 and opening 92 of a window 94 to the top of the P+ germanium region, as shown in FIG. 14.

Figure 15:
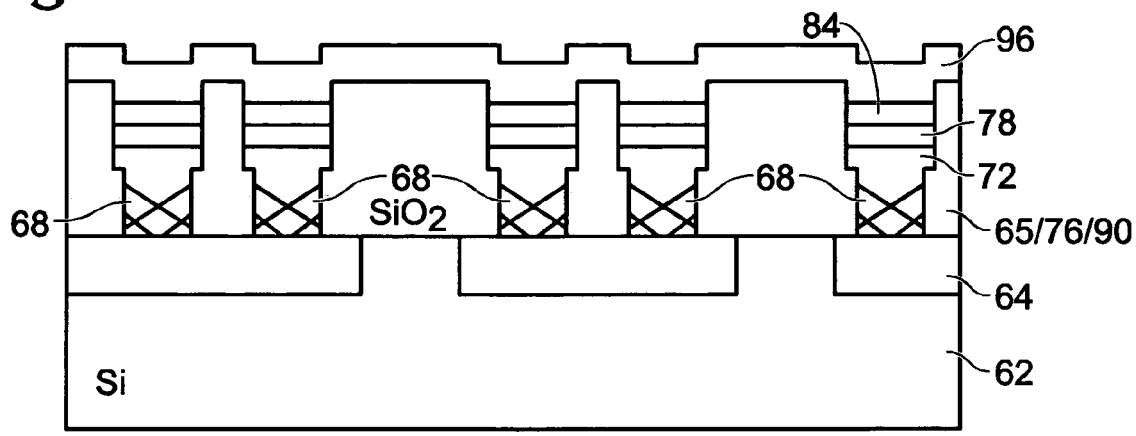

P+ polysilicon or ITO ($In_2O_3$—$SnO_2$) 96 is next deposited 98 to cover the wafer with a layer of conductive material, which subsequently becomes part of the sensing element of the photo detector. This is not a selective deposition process. For a germanium IR detector, e.g., sensitive to a wavelength longer than 1000 nm, P+ polysilicon may be used in this layer because it is IR transparent. However, for light detection of wavelengths less than 1000 nm, ITO film is preferred. Again, the P+ polysilicon may be formed by in situ doping of a polysilicon layer, or by ion implantation of intrinsic polysilicon. This is depicted in FIG. 15.

Figure 16:
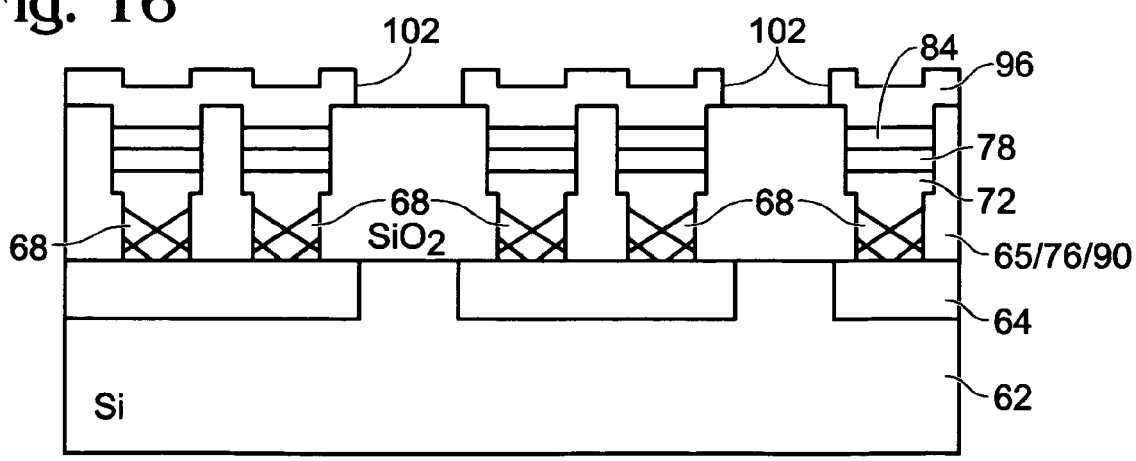
Figure 17:
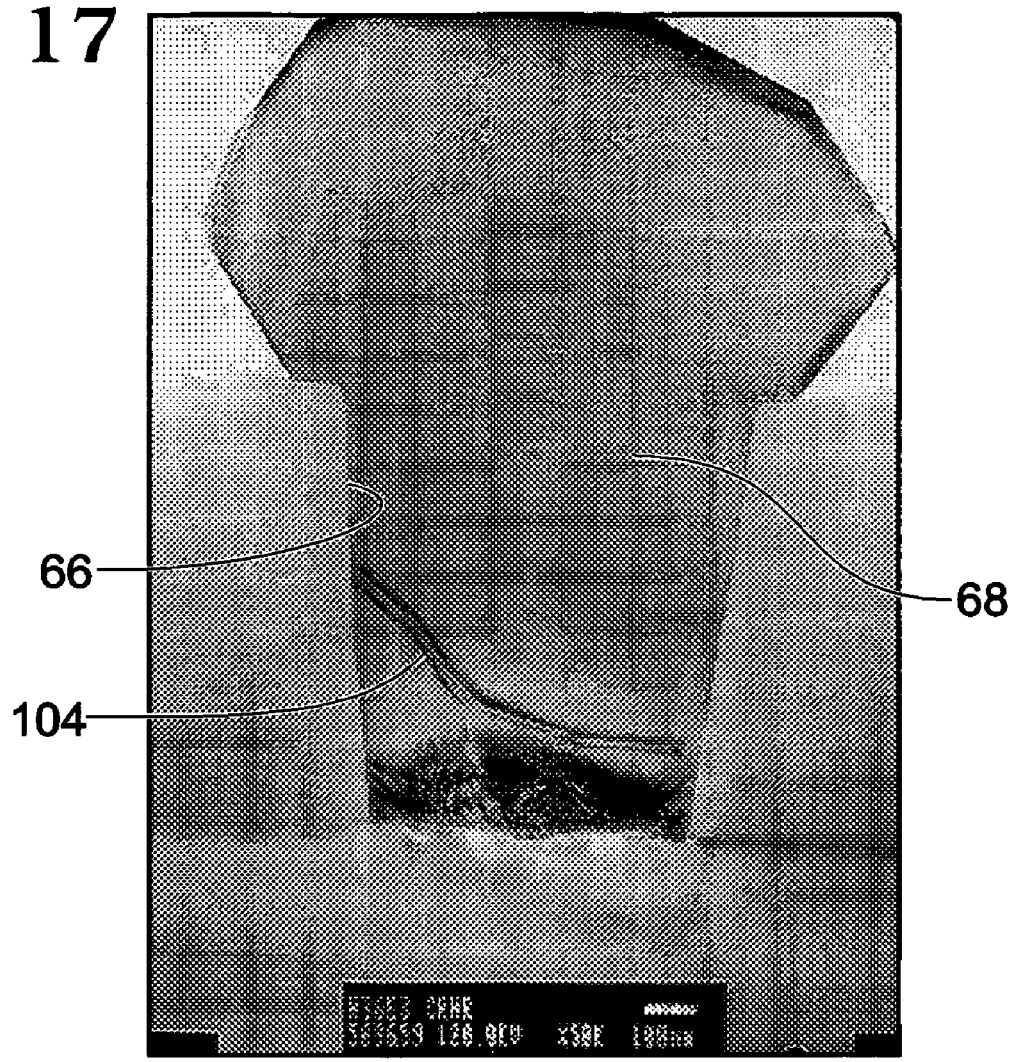
FIG. 17 is a side elevation of a ELO crystal fabricated according to the method of the invention.

The P+ polysilicon or ITO layer is etched 100 to define pixels 102, also referred to herein as sensing elements. The size of a sensing element is defined by this step, rather than by the size of the germanium ELO. After defining the sensing element, the electrical connection between the sensing element and control circuit is followed and complete the device fabrication, as shown in FIG. 16. A portion of the resultant sensing element is shown in FIG. 17, which clearly shows a threading dislocation 104, the propagation of which is stopped by the wall of contact hole 66.

The method of the invention as described is suitable for P—I—N germanium photodiodes fabrication. The same method of the invention may be used to fabricate N—I—P germanium photodiodes by simply changing the n-doped and p-doped layers to p-doped and n-doped layers, respectively.

As shown in the drawings and as described in this Specification, the description includes all steps of the best mode of practicing the invention. There are no additional steps, and the various layers, as described, are formed and/or deposited in sequence without any intervening steps or layers.

Thus, a method for fabricating a germanium photo detector having a planar surface through germanium epitaxial overgrowth has been disclosed. It will be appreciated that further variations and modifications thereof may be made within the scope of the invention as defined in the appended claims.

We claim:

1. A method of fabricating a germanium photo detector comprising:
    preparing a silicon substrate wafer;
    depositing and planarizing a silicon oxide layer;
    forming contact holes in the silicon oxide layer which communicate with the underlying silicon substrate;
    selectively growing an epitaxial germanium layer of a first type on the silicon oxide layer and in the contact holes;
    forming another germanium layer of the first type on the epitaxial germanium layer and the silicon oxide layer by epitaxial lateral overgrowth (ELO);
    smoothing and thinning the ELO germanium layer of the first type by chemical mechanical polishing;
    growing an intrinsic germanium layer on the ELO germanium layer of the first type and on any exposed silicon oxide layer;
    forming a germanium layer of a second type on the intrinsic germanium layer;
    depositing a silicon oxide overcoat over the wafer;
    opening a window through the silicon oxide overcoat to the germanium layer of the second type;
    depositing a layer of conductive material on the silicon oxide overcoat and in the windows therein; and
    etching the conductive material to form individual sensing elements.

2. The method of claim 1 which includes, after said preparing a silicon substrate; performing any CMOS process steps, including, implanting ions in the silicon substrate to from a N+ layer for a bottom electrode of a photodiode; and wherein said forming contact holes in the silicon oxide layer which communicate with the underlying silicon substrate includes forming contact holes which communicate with the N+ layer.

3. The method of claim 1 which includes forming contact holes spaced apart by a distance "D" and wherein said growing an intrinsic germanium layer on the silicon oxide layer includes growing an intrinsic germanium layer to a thickness "T", and wherein D>2 T.

4. The method of claim 1 wherein germanium of a first type is N+ germanium and germanium of a second type is P+ germanium.

5. The method of claim 1 wherein germanium of a first type is P+ germanium and germanium of a second type is N+ germanium.

6. The method of claim 1 wherein said growing an intrinsic germanium layer on the ELO germanium layer and any exposed silicon oxide layer includes growing intrinsic germanium to a thickness of between about 100 nm to 2000 nm.

7. The method of claim 1 wherein said smoothing and thinning the ELO germanium layer of the first type by chemical mechanical polishing includes, before said smoothing, depositing a layer of silicon oxide on the ELO germanium layer of the first type.

8. The method of claim 1 wherein said depositing a layer of conductive material includes depositing a layer of conductive material taken from the group of materials consisting of polysilicon and $In_2O_3$—$SnO_2$ (ITO).

9. The method of claim 8 wherein, for photodetector sensitive to light of a wavelength longer than 1000 nm, P+ polysilicon is deposited as the conductive material, and for photodetector sensitive to light of a wavelength shorter than 1000 nm, ITO film is deposited as the conductive material.

10. The method of claim 1 which further includes patterning and etching to remove an outer perimeter of the germanium layer of the second type and the intrinsic germanium after said forming a germanium layer of a second type on the intrinsic germanium layer.

11. A method of fabricating a germanium photo detector comprising:
    preparing a silicon substrate wafer;
    depositing and planarizing a silicon oxide layer;
    forming contact holes in the silicon oxide layer which communicate with the underlying silicon substrate;
    selectively growing an N+ epitaxial germanium layer on the silicon oxide layer and in the contact holes;
    forming another N+ germanium layer on the N+ epitaxial germanium layer and the silicon oxide layer by epitaxial lateral overgrowth (ELO);
    smoothing and thinning the ELO N+ germanium layer by chemical mechanical polishing;
    growing an intrinsic germanium layer on the ELO N+ germanium layer and on any exposed silicon oxide layer;
    forming a P+ germanium layer on the intrinsic germanium layer;
    patterning and etching to remove an outer perimeter of the P+ germanium layer and the intrinsic germanium;
    depositing a silicon oxide overcoat over the wafer;
    opening a window through the silicon oxide overcoat to the P+ germanium layer;
    depositing a layer of conductive material on the silicon oxide overcoat and in the windows therein; and
    etching the conductive material to form individual sensing elements.

12. The method of claim 11 which includes, after said preparing a silicon substrate; performing any CMOS process steps, including, implanting ions in the silicon substrate to from a N+ layer for a bottom electrode of a photodiode; and wherein said forming contact holes in the silicon oxide layer which communicate with the underlying silicon substrate includes forming contact holes which communicate with the N+ layer.

13. The method of claim 11 which includes forming contact holes spaced apart by a distance "D" and wherein said growing an intrinsic germanium layer on the silicon oxide layer includes growing an intrinsic germanium layer to a thickness "T", and wherein D>2 T.

14. The method of claim 11 wherein said growing an intrinsic germanium layer on the ELO N+ germanium layer and any exposed silicon oxide layer includes growing intrinsic germanium to a thickness of between about 100 nm to 2000 nm.

15. The method of claim 11 wherein said smoothing and thinning the ELO N+ germanium layer by chemical mechanical polishing includes, before said smoothing, depositing a layer of silicon oxide on the ELO N+ germanium layer.

16. The method of claim 11 wherein said depositing a layer of conductive material includes depositing a layer of conductive material taken from the group of materials consisting of polysilicon and $In_2O_3$—$SnO_2$ (ITO), and wherein for photodetector sensitive to light of a wavelength longer than 1000 nm, P+ polysilicon is deposited as the conductive material, and for photodetector sensitive to light of a wavelength shorter than 1000 nm, ITO film is deposited as the conductive material.

17. A method of fabricating a germanium photo detector comprising:
    preparing a silicon substrate wafer, including performing any CMOS process steps, including, implanting ions in the silicon substrate to from a N+ layer for a bottom electrode of a photodiode; and wherein said forming contact holes in the silicon oxide layer which communicate with the underlying silicon substrate includes forming contact holes which communicate with the N+ layer;
    depositing and planarizing a silicon oxide layer;
    forming contact holes in the silicon oxide layer which communicate with the underlying silicon substrate;
    selectively growing an N+ epitaxial germanium layer on the silicon oxide layer and in the contact holes;
    forming another N+ germanium layer on the N+ epitaxial germanium layer and the silicon oxide layer by epitaxial lateral overgrowth (ELO);
    depositing a layer of silicon oxide on the ELO N+ germanium layer;
    smoothing and thinning the ELO N+ germanium layer by chemical mechanical polishing;
    growing an intrinsic germanium layer on the N+ germanium ELO layer and on any exposed silicon oxide layer;
    forming a P+ germanium layer on the intrinsic germanium layer;
    patterning and etching to remove an outer perimeter of the P+ germanium layer and the intrinsic germanium;
    depositing a silicon oxide overcoat over the wafer; opening a window through the silicon oxide overcoat to the P+ germanium layer;
    depositing a layer of conductive material on the silicon oxide overcoat and in the windows therein, including, depositing a layer of conductive material taken from the group of materials consisting of polysilicon and $In_2O_3$—$SnO_2$ (ITO), and wherein for a photodetector sensitive to light of a wavelength longer than 1000 nm, P+ polysilicon is deposited as the conductive material, and for photodetector sensitive to light of a wavelength shorter than 1000 nm, ITO film is deposited as the conductive material; and
    etching the conductive material to form individual sensing elements.

18. The method of claim 17 which includes forming contact holes spaced apart by a distance "D" and wherein said growing an intrinsic germanium layer on the silicon oxide layer includes growing an intrinsic germanium layer to a thickness "T", and wherein D>2 T.

19. The method of claim 17 wherein said growing an intrinsic germanium layer on the ELO N+ germanium layer and any exposed silicon oxide layer includes growing intrinsic germanium to a thickness of between about 100 nm to 2000 nm.

* * * * *